(12) United States Patent
Chang (10) Patent No.: US 6,674,133 B2
(45) Date of Patent: *Jan. 6, 2004

(54) TWIN BIT CELL FLASH MEMORY DEVICE (75) Inventor: Kent Kuohua Chang, Taipei (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/063,879

(22) Filed: May 21, 2002

(65) Prior Publication Data

US 2003/0075738 A1 Apr. 24, 2003

Related U.S. Application Data (62) Division of application No. 09/682,809, filed on Oct. 22, 2001, now Pat. No. 6,420,237.

(51) Int. Cl.$^7$ ................................. H01L 29/76
(52) U.S. Cl. ................. 257/391; 257/390; 257/217; 438/300; 438/304
(58) Field of Search ................. 257/390, 391, 257/217, 276, 289, 368; 438/300–304

(56) References Cited

U.S. PATENT DOCUMENTS 6,538,292 B2 * 3/2003 Chang et al. ............... 257/391

* cited by examiner

Primary Examiner—D. Le
(74) Attorney, Agent, or Firm—Winston Hsu (57) ABSTRACT

The present invention provides a twin bit cell flash memory device and its fabricating method. The method is to first form a gate oxide layer on the surface of the silicon substrate followed by forming a polysilicon germanium ($Si_{1-x}Ge_x$, x=0.05~1.0) layer on the gate oxide layer. Thereafter, an ion implantation process is performed to form at least one insulating region in the polysilicon germanium layer for separating the polysilicon germanium layer into two isolated conductive regions and forming a twin bit cell structure. Then, a dielectric layer is formed on the polysilicon germanium layer and a photo-etching-process (PEP) is performed to etch portions of the dielectric layer and the polysilicon germanium layer for forming a floating gate of the twin bit cell flash memory. Finally, a control gate is formed over the floating gate.

9 Claims, 9 Drawing Sheets

TWIN BIT CELL FLASH MEMORY DEVICE

CROSS REFERENCE TO RELATED APPLICATIONS

This application is a division of application Ser. No. 09/682,809 filed Oct. 22, 2001, now U.S. Pat. No. 6,420,237.

BACKGROUND OF INVENTION

1. Field of the Invention

The present invention provides a twin bit cell flash memory device and its fabricating method.

2. Description of the Prior Art

A read only memory (ROM) device, comprising a plurality of memory cells, is a semiconductor device with a primary function of memory storage. The ROM device is widely used in computer data storage and memory. Depending on the method of storing data, the ROM can be divided into several types such as Mask ROM, programmable ROM (PROM), erasable programmable ROM (EPROM), and electrically erasable programmable ROM (EEPROM).

Differing from other types of ROM that use a polysilicon or metal floating gate, a nitride read only memory (NROM) uses an insulating dielectric layer as a charge-trapping medium. Due to a highly-compacted nature of the silicon nitride layer, hot electrons tunneling from the MOS transistor into the silicon nitride layer are trapped to form an unequal concentration distribution so as to increase data reading speed and avoid current leakage.

Figure 1:
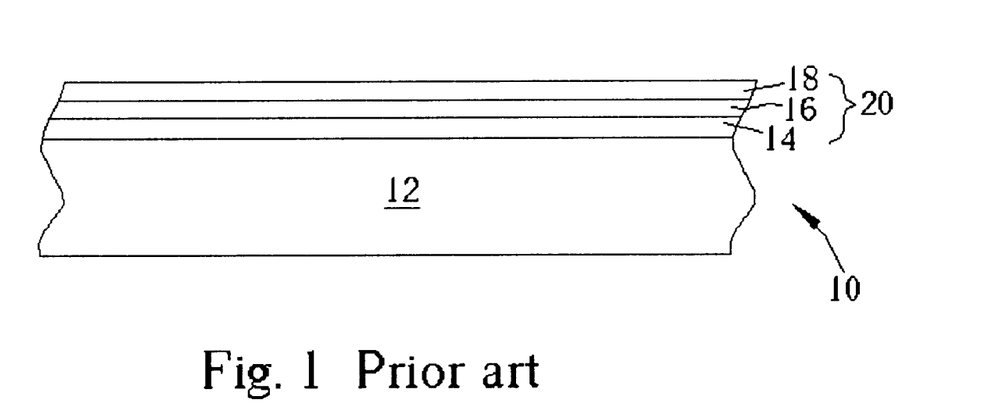
FIG. 1 to FIG. 4 are schematic diagrams of a prior art method for fabricating an NROM.

Please refer to FIG. 1 to FIG. 4 of schematic diagrams of a prior art method for fabricating an NROM. As shown in FIG. 1, according to the prior art for fabricating a gate of the NROM, a semiconductor wafer 10 comprising a P-type silicon 12 is first provided. An oxidation process within a temperature range of 750° C.~1000° C. is then performed, to form an oxide layer with a thickness of 50–150 angstroms as a bottom oxide layer 14 on a surface of the silicon substrate 12. Low-pressure chemical vapor deposition (LPCVD) is used to deposit a silicon nitride layer 16 with a thickness of 20 to 150 angstroms on the bottom oxide layer 14, which functions as a charge trapping layer. Finally, an annealing process is performed under a high temperature of 950°C. for a duration of 30 minutes to repair the structure of the silicon nitride layer 16. Water and steam are injected to perform a wet oxidation process to form a silicon oxy-nitride layer with a thickness of 50 to 150 angstroms as a top oxide layer 18. The bottom oxide layer 14, the silicon nitride layer 16 and the top oxide layer 18 comprise an ONO layer 20 on the surface of the silicon substrate 12.

Figure 2:
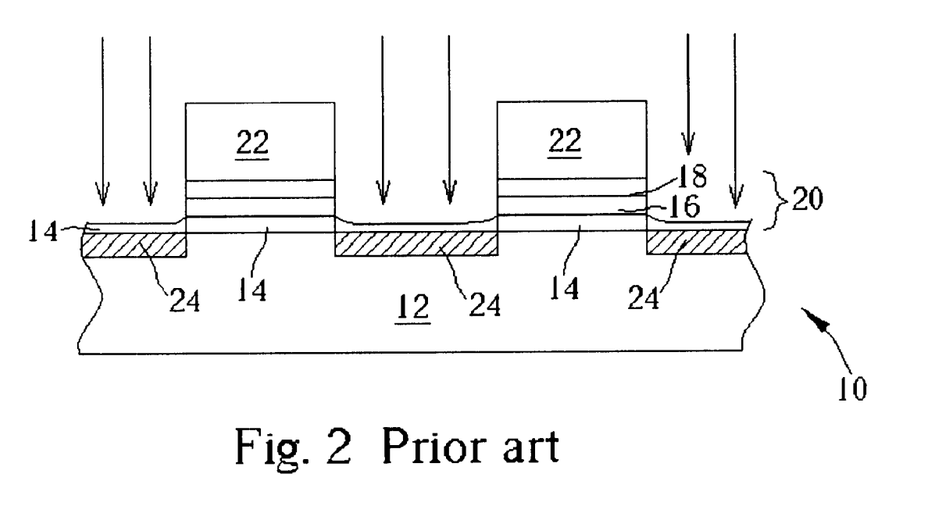

Please refer to FIG. 2 of a photoresist layer 22 formed on a surface of the ONO layer 20, and a photolithographic and etching process performed to form patterns in the photoresist layer 22 for defining the position of a bit line. Following that, the patterns of the photoresist layer 22 are used as a mask for performing a dry etching process to remove the top oxide layer 18 and the silicon oxide layer 16 which are not covered by the photoresist layer 22, and to etch portions of the bottom oxide layer 14 to a predetermined depth. An arsenic (As) ion implantation process is performed with an ion concentration of $2{\sim}4{\times}10^{15}/cm^2$ and with an energy of 50 Kev for forming a plurality of doped areas in the silicon substrate 12, which function as bit lines 24, i.e. buried drains of the memory device. Thereafter, the photoresist layer 22 is completely removed.

Figure 3:
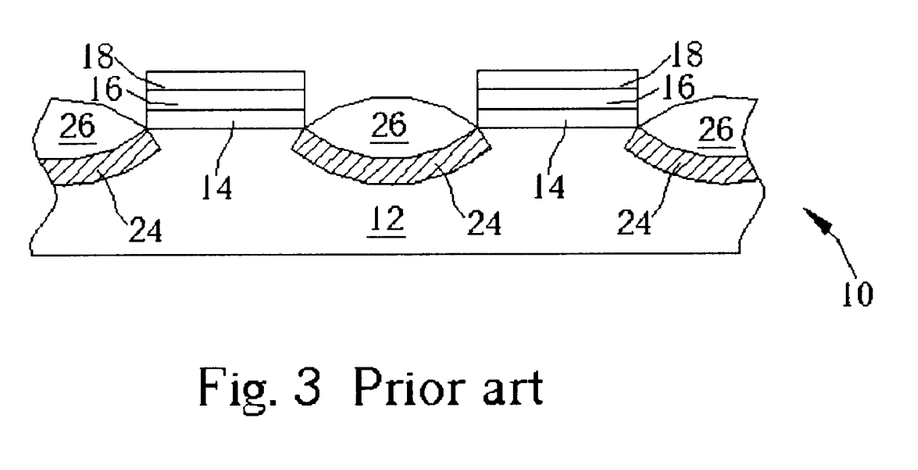
Figure 4:
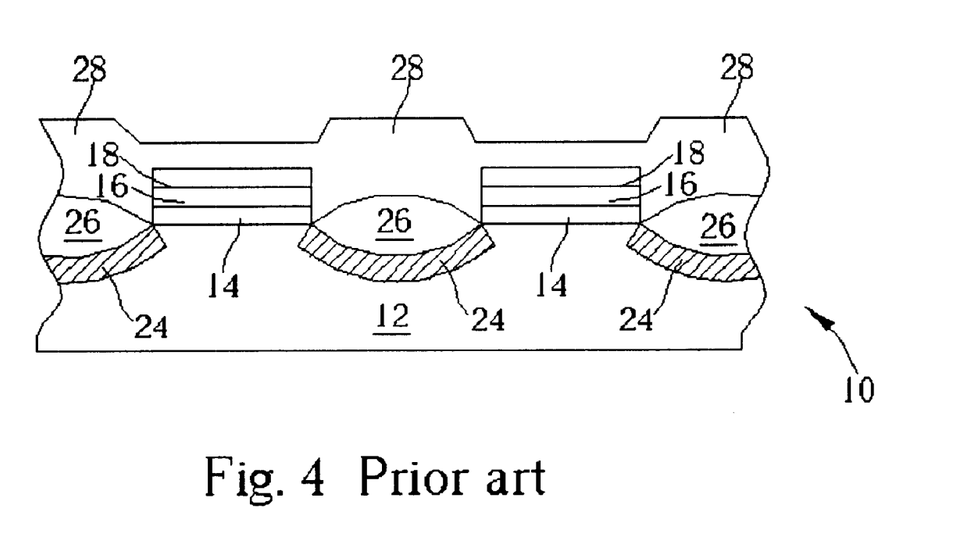

As FIG. 3 shows, a thermal oxidation process is used to form a field oxide layer 26 on a top surface of bit lines 24 for separating each silicon oxide layer 16 and simultaneously to activate the dopants in each bit line 24. Finally, as FIG. 4 shows, a polysilicon layer or a polysilicide layer is deposited on the surface of the ONO layer 20 that functions as a word line 28.

Since an NROM uses the charge trapping layer as a charge storage medium, hot electrons injected in the charge trapping layer during programming of the device form a distribution curve with respect to injection energy. Therefore, electron secondary injection easily occurs to form an electron tail and wider charge distribution. When an erasing process is performed, the distribution curve of electric holes injected into the charge trapping layer cannot completely overlap the distribution curve of injected electrons, leading to an incomplete erasure or longer erasing time.

SUMMARY OF INVENTION

It is therefore a primary objective of the present invention to provide a structure of a twin bit cell flash memory device for increasing memory cell density and to solve the problem of incomplete erasure that occurs in the NROM of the prior art.

It is another object of the present invention to provide a method for fabricating a flash memory device so as to fabricate a twin bit cell flash memory device with high integration. As well, the problem of incomplete erasure of NROM is prevented and reliability of data retention is improved.

In an embodiment of the present invention, the method comprises firstly forming a gate oxide layer on the surface of the silicon substrate followed by forming a polysilicon germanium ($Si_{1-x}Ge_x$, x=0.05~1.0) layer on the gate oxide layer. Thereafter, an ion implantation process is performed to form at least one insulating region in the polysilicon germanium layer for separating the polysilicon germanium layer into two isolated conductive regions and forming a twin bit cell structure. Then, a dielectric layer is formed on the polysilicon germanium layer and a photo-etching-process (PEP) is performed to etch portions of the dielectric layer and the polysilicon germanium layer for forming a floating gate of the twin bit cell flash memory. Finally, a control gate is formed over the floating gate.

The present invention uses a conductive layer as a charge trapping layer and uses an oxidation region to separate the charge trapping layer into two isolated charge capture regions. Hence, the two regions can be respectively read and be programmed to form a twin bit cell structure. Additionally, the two charge capture regions are both conductive layers comprising poly silicon germanium, so the combination efficiency of electrons and electric holes is very high in the conductive layer. Therefore, the problem of incomplete erasure of NROM is prevented and reliability of data retention is improved.

These and other objectives of the present invention will no doubt become obvious to those of ordinary skill in the art after having read the following detailed description of the preferred embodiment, which is illustrated in the various figures and drawings.

DETAILED DESCRIPTION

Figure 5:
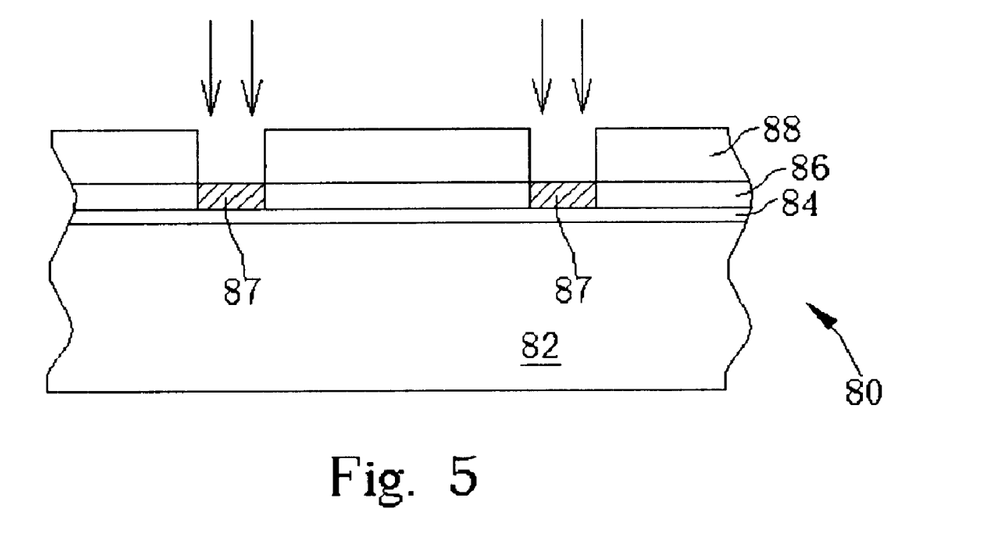
FIG. 5 to FIG. 8 are schematic diagrams of a present invention method for fabricating a twin cell flash memory device.

Please refer to FIG. 5 to FIG. 8 of schematic diagrams of a present invention method for fabricating a twin bit cell flash memory device. As shown in FIG. 5, according to the present invention for fabricating a twin bit cell flash memory device, a semiconductor wafer 80 comprising a P-type silicon substrate 82 is first provided. A high temperature oxidation process is performed to form a silicon oxide layer with a thickness of 50 to 150 angstroms (Å) as a gate oxide layer 84 on the surface of the silicon substrate 82. Then, a chemical vapor deposition (CVD) process using silane ($SiH_4$), germane ($GeH_4$) and hydrogen as reacting gases at a temperature of 450° C. to 620° C. is performed to deposit a polysilicon germanium ($Si_{1-x}Ge_x$, x=0.05~1.0) layer with a thickness of 500 to 1000 angstroms (Å) on the surface of the gate oxide layer 84, which functions as a conductive layer 86.

A photoresist layer 88 is formed on the surface of the conductive layer 86, and patterns of isolation regions 87 in the conductive layer 86 are defined in the photoresist layer 88. An ion implantation process is performed to implant a high concentration of oxygen dopant, or a high concentration of nitrogen dopant into the conductive layer 86. The implanting dose for oxygen ions is $1~2\times10^{18}/cm^2$, with an implanting energy of 20 to 80 KeV. A high temperature annealing process with a temperature range of 950° C. to 1150° C. is then performed to react the dopants implanted in the conductive layer 86 with the polysilicon germanium of the conductive layer 86 for forming an isolation region 87 composed of silicon oxide or silicon nitride, which separates the conductive layer 86 into two isolated conductive regions. The silicon oxide or silicon nitride comprising the isolation region 87 is also formed by reacting the dopants implanted in the conductive layer 86 with silicon germanium of the conductive layer 86 during the subsequent high temperature driving-in process performed for forming sources and drains of the memory device so as to reduce thermal budget of the semiconductor process.

Figure 6:
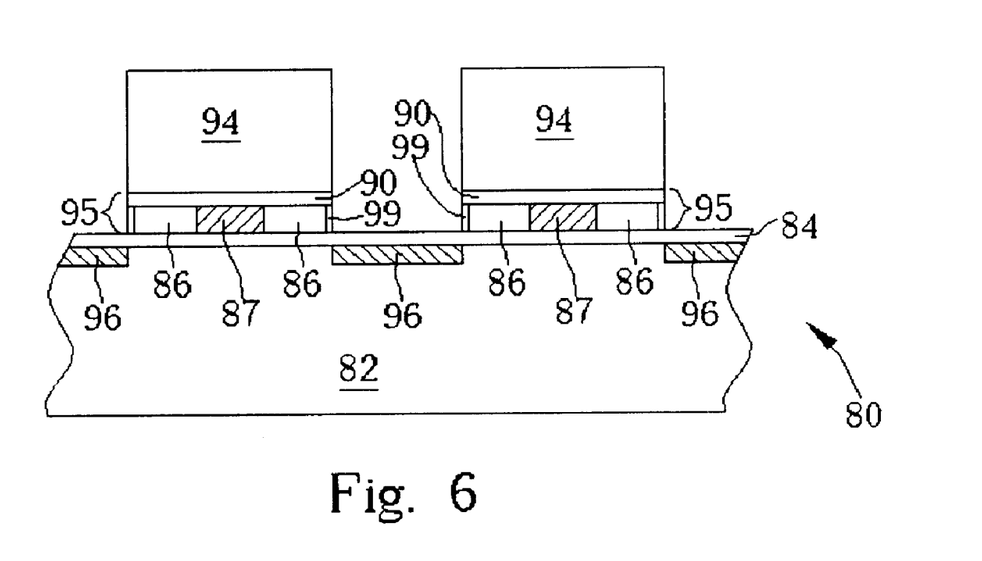

As FIG. 6 shows, a silicon oxide layer with a depth of 50 to 150 angstroms (Å) formed on the surface of the conductive layer 86 functions as a dielectric layer 90. A patterned photoresist layer 94 is then formed on the surface of the dielectric layer 90 to define patterns of floating gate 95 of the flash memory device, with each floating gate 95 comprising two isolated conductive regions 70. The patterned photoresist layer 94 is used as a hard mask to etch portions of the dielectric layer 90 and the conductive layer 89 for forming a plurality of floating gates 95. Thereafter, an arsenic (As) ion implantation process with an implant dosage of $2~4\times10^{15}/cm^2$ and implantation energy of 50 Kev is performed to form a plurality of doped areas in the silicon substrate 82, which function as bit lines 96 of the memory device. Then the photoresist layer 94 is completely removed. In the second embodiment, the dielectric layer 90 can be directly formed on the conductive layer 86 when depositing the polysilicon germanium on conductive layer 86 followed by performing an ion implantation process to form the isolated regions 87.

Figure 7:
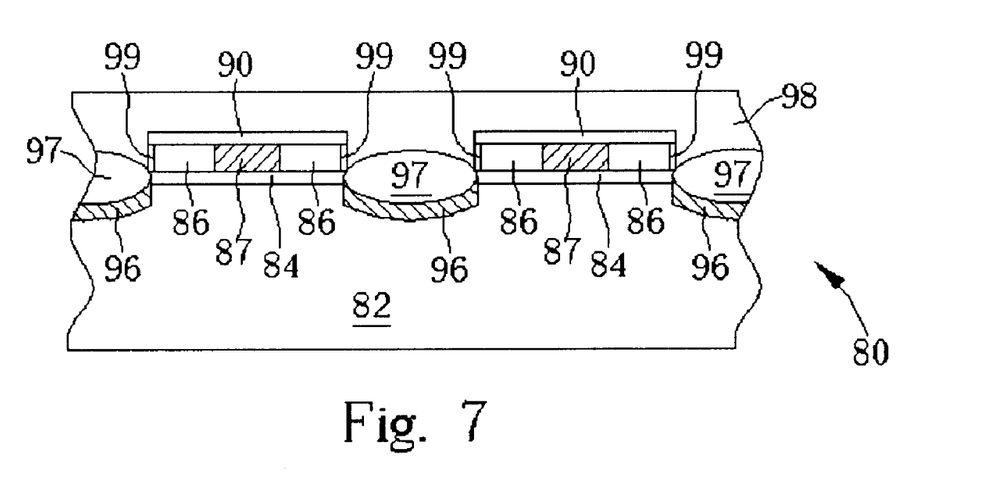

As shown in FIG. 7, a thermal oxidation process is performed to form a field oxide layer 97 on the surface of the bit line 96 to separate each conductive layer 86. As well, the thermal oxidation process also actives the dopants in each bit line 96. In the third embodiment, the thermal oxidation process forming the field oxide layer 97 simultaneously oxidize the surface of the conductive layer 86 to form the dielectric layer 90 after the formation of conductive layer 86, isolation region 87 and floating gates 95. The thermal oxidation process also forms an oxide layer 99 on the exposed side walls of each conductive layer 86.

Figure 8:
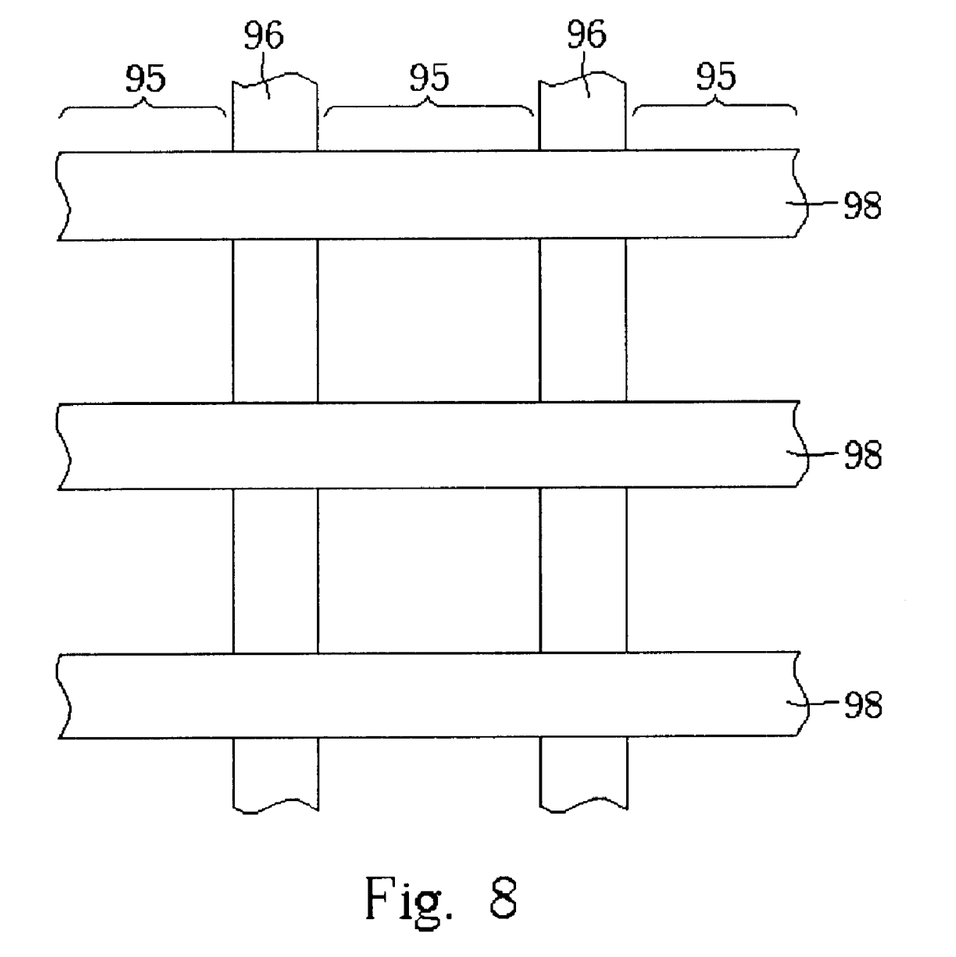

Finally, a polysilicon layer or a polysilicide layer is deposited on a surface of the floating gate 95 as a word line 98. After the deposition process, a plurality of rows of word lines 98 is formed on the semiconductor wafer 80 approximately perpendicular to the bit lines 96, as shown in FIG. 8.

Figure 9:
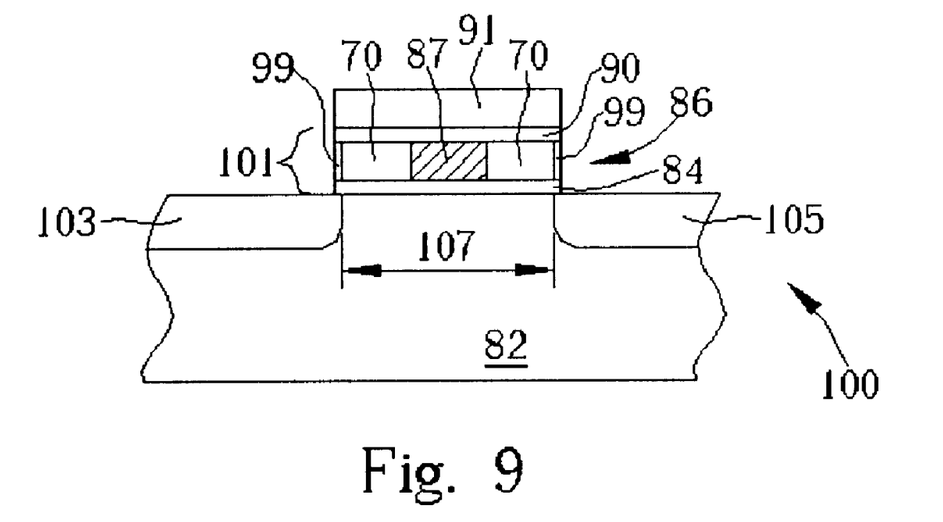
FIG. 9 is a cross-sectional diagram of a structure of a twin bit cell flash memory device according to the present invention.

Please refer to FIG. 9 of a cross-sectional diagram of the structure of a twin bit cell flash memory device 100 according to the present invention. The twin bit cell flash memory device 100 contains a stacked gate 101, a source 103 and a drain 105. There is a channel 107 on the surface of the substrate 82 between the source 103 and the drain 105. The stacked gate 101 comprises a gate oxide layer 84, a conductive layer 86, a dielectric layer 90 and a control gate 91 formed in sequence on the surface of the channel 107. The control gate 91 is a portion of word line 98 that overlaps the floating gate 95. The conductive layer 86 contains another isolation region 87 separating the conductive layer 86 into two isolated conductive regions 70, to form a twin bit cell structure. An oxide layer 99 can be formed on the exposed side walls of each conductive layer 86 for preventing direct contact between each conductive layer 86 and word line 98. Each conductive region 70 functions as a charge trapping layer to receive and hold electrons injected into the conductive region 70, so forming the twin bit cell flash memory device 100.

The conductive layer 86 of the twin bit cell flash memory device 100 shown in FIG. 9 is composed of a polysilicon germanium layer with the chemical composition of $Si_{1-x}Ge_x$, x=0.05~1.0. The insulating region is formed by implanting a high concentration of oxygen dopant by performing an oxygen ion implantation process with an implanting dose of $1~2\times10^{18}/cm^2$ and an implanting energy of 20–80 KeV into the polysilicon germanium layer, and then performing a high temperature annealing process with a temperature between 950° C. and 1150° C. Furthermore, the insulating region 87 also can be formed by implanting a high concentration of nitrogen dopant into the polysilicon germanium layer, and then performing a thermal process.

The twin bit cell flash memory device according to the present invention uses a conductive layer as a charge trapping layer, and an isolating region is formed in the conductive layer to separate the conductive layer into two isolated charge capture regions. Hence, the two regions can be respectively read and programmed to form a twin bit cell structure.

In contrast with the NROM manufactured by the prior art method, the present invention provides a structure of a twin bit cell flash memory device so as to increase the integration of the memory device without reducing critical dimensions of the wafer in different processes. Therefore, misalignment that occurs during the photolithographic process for defining floating gates in the photoresist layer, and which leads to lower process yields, is prevented. As well, the active dopant concentration within the conductive layer composed of polysilicon germanium is increased so as to reduce the poly depletion effect resulting in signal delay of the gate. The combination efficiency of electrons and electric holes is very high in the conductive layer, so the problem of incomplete erasure of NROM is prevented and the reliability of data retention is improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A twin bit cell flash memory device, the device comprising:
   a semiconductor substrate;
   a source and a drain positioned in a predetermined area of the semiconductor substrate, and the drain and the source separated by a predetermined distance;
   a channel positioned on the surface of the semiconductor substrate between the source and the drain;
   a first dielectric layer covering the surface of the channel;
   a polysilicon germanium layer covering the surface of the first dielectric layer, the polysilicon germanium layer having an insulating region for separating the polysilicon germanium layer and forming two isolated conductive regions so as to form a twin bit cell structure;
   a second dielectric layer covering the surface of the polysilicon germanium layer; and
   a gate covering the surface of the second dielectric layer;
   wherein each conductive region serves as a charge trapping layer so as to receive and store electrons injected into the conductive region to generate a respective bit.

2. The flash memory device of claim 1 wherein the semiconductor substrate is a P-type substrate, and the source and the drain are both N-type doped areas.

3. The flash memory device of claim 1 wherein the semiconductor substrate is an N-type substrate, and the source and the drain are both P-type doped areas.

4. The flash memory device of claim 1 wherein the chemical composition of the polysilicon germanium layer is $Si_{1-x}Ge_x$ x=0.05~1.0.

5. The flash memory device of claim 1 wherein the insulating region is formed by implanting a high concentration of oxygen dopant into the polysilicon germanium layer, and then performing a thermal process.

6. The flash memory device of claim 5 wherein the high concentration of oxygen dopant is formed by an oxygen ion implantation process, the implanting dosage being approximately $1~2\times10^{18}/cm^2$, the implanting energy ranging from 20 KeV to 80 KeV.

7. The flash memory device of claim 5 wherein the thermal process is a high temperature annealing process with a temperature range of 950° C. to 1150° C.

8. The flash memory device of claim 1 wherein the insulating region is formed by implanting a high concentration of nitrogen dopant into the polysilicon germanium layer, and then performing a thermal process.

9. The flash memory device of claim 1 wherein an oxide layer is also formed on the exposed side walls of each conductive region.

* * * * *